United States Patent [19]

Derkits, Jr.

[11] Patent Number: 5,079,130
[45] Date of Patent: Jan. 7, 1992

[54] PARTIALLY OR FULLY RECESSED MICROLENS FABRICATION

[75] Inventor: Gustav E. Derkits, Jr., New Providence, N.J.

[73] Assignee: AT&T Bell Laboratories, Murray Hill, N.J.

[21] Appl. No.: 529,055

[22] Filed: May 25, 1990

[51] Int. Cl.$^5$ .............................. G03C 5/00
[52] U.S. Cl. ............................ 430/321; 430/323; 430/330; 359/565; 359/619
[58] Field of Search ............... 430/321, 323, 330, 312; 350/167, 162.16

[56] References Cited

U.S. PATENT DOCUMENTS

| | | | |
|---|---|---|---|
| 4,389,482 | 6/1983 | Bargon et al. | 430/325 |
| 4,530,736 | 7/1985 | Mutter | 430/321 |

OTHER PUBLICATIONS

Wada, O., "Ion-Beam Etching of InP and Its Application to the Fabrication of High Radiance InGaAsP/InP Light Emitting Diodes," *J. Electrochem. Soc.: Solid-State Science and Tech.*, vol. 131, pp. 2373-2380.

Plasma Technology Listing.

*Primary Examiner*—Charles L. Bowers, Jr.
*Assistant Examiner*—Janis L. Dote
*Attorney, Agent, or Firm*—David I. Caplan

[57] ABSTRACT

Partially recessed microlenses (31, 32; FIG. 3) are made in a substrate (10) by a technique including the steps of forming a hard-baked patterned layer (21, 22, 64, FIG. 2) on a surface of the substrate, this patterned layer having at least one island portion (21, 22) surrounded by an auxiliary portion (64), and simultaneously etching this hard-baked patterned layer and the substrate to remove at least a portion of the thickness of the hard-baked layer. The island portions are located at areas overlying where microlenses are desired. The volume of the auxiliary portions of the hard-baked patterned layer is advantageously significantly greater than that of the island portions.

Full recessed microlenses (31, 32; FIG. 6) are made by adding a step in the above technique, namely, the step of forming another hard-baked patterned layer (94) covering only the auxiliary portions of the above-mentioned patterned layer prior to the etching.

17 Claims, 2 Drawing Sheets

5,079,130

PARTIALLY OR FULLY RECESSED MICROLENS FABRICATION

TECHNICAL FIELD

This invention relates to fabrication of optical lenses and more particularly to methods for making microminiature lenses (microlenses)—i.e., having a thickness of less than 100 μm—in III-V semiconductors and other materials. As used herein, the term "lens" encompasses any lenticularly-shaped surface.

BACKGROUND OF THE INVENTION

Lenses and microlenses are useful in a variety of contexts. Such contexts include, for example, coupling a light beam from a III-V semiconductor light emitting diode (LED) to an optical fiber, as well as coupling a light beam from an optical fiber to a III-V semiconductor optical detector, such as an avalanche photodetector (APD). Such contexts also include coupling a light beam from one fiber to one other fiber or to a plurality of other fibers. For use in some other contexts, the lenses are metallized (coated with a thin metallic layer), to form mirrors.

A method of fabricating InP (indium phosphide) microminiature lenses is described in a paper entitled "Ion-Beam Etching of InP and Its Application to the Fabrication of High Radiance InGaAsP/InP Light Emitting Diodes" by O. Wada, published in *J. Electrochem. Soc.: Solid-State Science and Technology*, Vol. 131, No. 10, pp. 2373–2380 (1984). In that method, first a photoresist layer was deposited on a major surface of an InP substrate. Then the photoresist layer was patterned solely into circularly cylindrical island(s) by conventional photolithographic techniques. The resist was then uniformly exposed to UV radiation. Next, the patterned photoresist was baked at a sufficiently high temperature so that each island was transformed into an island having a dome or spherical contour whose shape was determined by the perimeter of the island and by surface tension. Then the substrate was subjected to Argon ion-beam etching, the beam being oriented at an angle $\theta$ with respect to the normal to the major surface of the substrate. During the etching, the substrate was rotated about an axis along a radius of the spherical contour perpendicular to the major surface of the substrate. In this way, the final result was an (elliptically) aspheric microlens formed in the substrate.

The microlenses thus obtained in the above-described method suffered from undesirable surface roughness (except for those portions of the spherical surface whose normals were oriented at angles of approximately 65° with respect to the ion beam). Although such roughness might be ameliorated by wet etching, such a procedure would entail an extra step that would require careful control over the parameters of the procedure. Moreover, the ratios of diameter to focal length of microlenses obtained in the above-described method are not as high as desired for some practical applications. Also, because of the non-unity ratio of etch rates k (as used on p. 2378 of the above-mentioned paper) of the substrate to the photoresist mask, only prolate elliptically aspheric microlenses, with only one axis of symmetry perpendicular to the substrate surface, are obtainable in the above-described method. However, in some applications spherical lenses, oblate elliptically aspheric lenses, or astigmatic aspheric lenses having two axes of symmetry in the substrate surface are desired, such as in systems where a semiconductor edge laser is to be coupled to a circular fiber by a cylindrically-corrected microlens. Finally in some contexts—particularly where the lenses are to be protected against metallic or other features that are ultimately desired for device function—it is desirable that the lenses or mirrors be fully recessed from the substrate surface, or at least partially recessed, for mechanical protective purposes. As used herein, the term "partially recessed" refers to a situation in which each lens is surrounded by a layer of material located on the substrate and having a thickness (height above the substrate) which is equal to a substantial fraction (less than unity) of the thickness (height, h) of the lens; whereas the term "fully recessed" refers to a situation where the surrounding layer of material has a height which is equal to or greater than that of the lens. However, the lenses made by the above-described method were not at all recessed.

Except for partially or fully recessing the lenses, the foregoing problems can be solved by using, instead of ion etching, a simultaneous gaseous chemical and energetic ion etching step, such as a reactive ion etching (RIE) process—i.e., by using an ion-assisted chemical etching technique using atomic or molecular radicals together with ions formed in a low pressure glow discharge—or by using a multiple beam etching process in which reactive chemical species are supplied by separate chemical beams as in CAIBE (chemically assisted ion beam etching). Thus, the problem of recessing remains, and hence it would be desirable to have a method for making lenses or microlenses in a substrate that are either partially or fully recessed from the substrate surface.

SUMMARY OF THE INVENTION

In accordance with one embodiment, this invention involves a method of making a partially recessed lens in a prescribed portion of a substrate, the lens having a prescribed perimeter, comprising the steps of (a) forming and baking a first patterned layer overlying a surface of the substrate, the first patterned layer having both an island portion overlying the prescribed portion of the substrate and an auxiliary portion surrounding the island portion, whereby the island portion of the first patterned layer becomes a hard-baked island portion of the first patterned layer having the prescribed perimeter and a prescribed volume, and the auxiliary portion of the first patterned layer becomes a hard-baked auxiliary portion of the first patterned layer surrounding the hard-baked island portion thereof and having a larger volume than the prescribed volume; and (b) subjecting both the substrate and the hard-baked island and auxiliary portions of the first patterned layer simultaneously to an etching step sufficient to remove at least a portion of the thicknesses of both the hard-baked island and the auxiliary portions of the first patterned layer.

In accordance with another embodiment, this invention involves a method of making a fully recessed lens in a prescribed portion of a substrate, the lens having a prescribed perimeter, comprising the above-recited steps (a) and (b) wherein, prior to step (b), a second hard-baked patterned layer is formed covering the auxiliary portions of the first hard-baked patterned layer.

The removal by etching of only a portion of the thickness of the first hard-baked patterned layer results in a partial lens, i.e., a lens having only a peripheral curved portion; whereas the removal of the entire thickness of the first hard-baked patterned layer results in a full lens, i.e., having a paraxial curved portion in addition to its peripheral curved portion, the sum of these two curved portions having no visible boundary therebetween.

Preferably the etching step for either the partially or fully recessed lenses of this invention is performed by a technique in which both gaseous chemical species (atomic or molecular) and energetic ion species are effective in the etching process, such as RIE or CAIBE. Also preferably the volume of each auxiliary portion of the patterned layer is greater than that of the associated island portion surrounded by such auxiliary portion.

In this way, partially or fully recessed microlenses can be obtained. Neither of such recesses can be obtained using the above-described ion milling process because of the use of a resist layer patterned solely into islands.

BRIEF DESCRIPTION OF THE DRAWING

This invention together with its features, advantages, and characteristics may be better understood from the following detailed description when read in conjunction with drawing in which.

Only for the sake of clarity, none of the drawings is to any scale.

DETAILED DESCRIPTION

Because of the special fabrication difficulties encountered with a III-V semiconductor substrate like InP, owing to the nonvolatility of the In component relative to the P component, the invention first will be described in detail with respect to an InP substrate, but it should be understood that the scope of the invention is not necessarily so limited, and that it can be practiced with such other substrates as gallium arsenide (GaAs) glass, silicon, quartz, or sapphire. In particular, it has been successfully practiced with silicon, sapphire, and quartz. In any case, the substrate is an optically transparent body—unless the lens is to be coated with a metal layer for use as a mirror, in which case the substrate need not be transparent.

Figure 1:
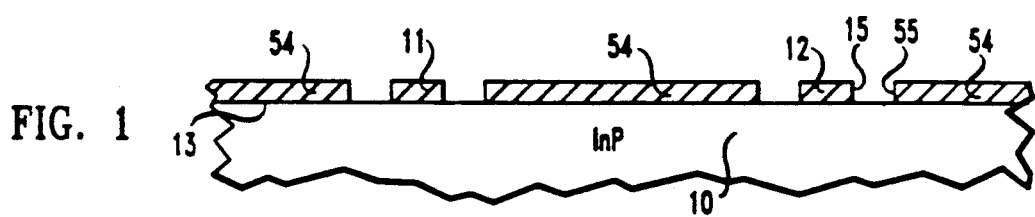
FIGS. 1-3 are side views in cross section of various stages of manufacture of a pair of microlenses being fabricated in accordance with an illustrative specific embodiment of the invention.
Figure 4:
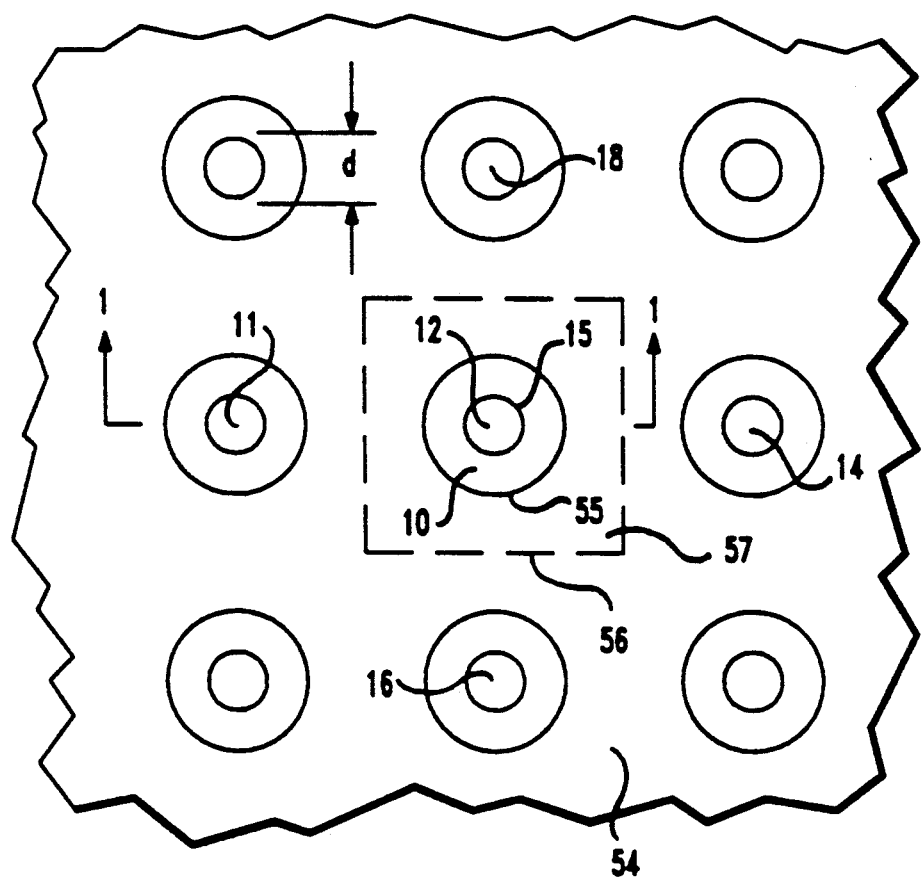
FIG. 4 is a top view of FIG. 1.

As shown in FIGS. 1 and 4, upon a top major surface 13 of an InP substrate 10 there is a pair of resist islands 11 and 12 surrounded by auxiliary resist portions 54. These resist islands together with the auxiliary resist portions can be formed by first coating the entire top surface of the substrate 10 with a layer of the resist having a uniform thickness and then patterning the layer by a known method, typically patterned photoexposure followed by development with a wet etch. Typically, the material of which the patterned layer(s) is formed is a photo-resist, but other materials can be used—such as a phosphosilicate glass or a polyimide—that can be thermally relaxed to form a hard-baked island having a prescribed perimeter, such as a sessile drop. The edges 15 of the islands can form circles (FIG. 4) or other desired contours. The diameter d of the islands is typically about 50 to 100 $\mu$m, and they are spaced apart by a distance of typically about 10 or 20 $\mu$m to 400 $\mu$m. The thickness of the resist layer (before baking to follow) is typically in the range of about 1 to 15 $\mu$m. The distance between the closest edge 55 of the auxiliary resist portion 54 and the edge 15 of the island 12 is typically about 20 $\mu$m.

As further indicated in FIG. 4, in the case of islands whose centers form a square array, the island 12 of diameter d can be viewed as surrounded by an associated volume 57 of resist contained between the edge 55 of the auxiliary resist portion 54 and an imaginary square 56 drawn midway between the center of the island 12 and the centers of its neighboring islands 11, 14, 16, and 18. It is preferred in this invention that this associated volume of resist be larger than the volume of resist contained in the island 12 itself.

Figure 2:
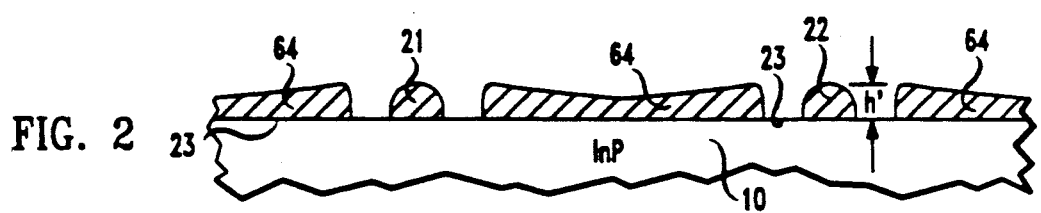

Next, the patterned resist is hard-baked—i.e., is heated, preferably by hot plate baking—to a temperature above a point at which deformation to a minimal surface occurs. In this way, a pair of resist islands 21 and 22 are formed (FIG. 2) surrounded by auxiliary resist portions 64. After cooling, the islands and the auxiliary portions of resist are thus hard-baked, whereby the height h' of the top of the islands above the surface 23 of the substrate 10 is typically about 1.5 to 20 $\mu$m. Note that after the hard-baking (FIG. 2), the tops of the resulting hard-baked resist island 21 and 22 are located slightly but only slightly higher than the highest point of the surface of the resulting auxiliary hard-baked resist portions 64. Thus, these islands are "partially recessed".

Figure 3:
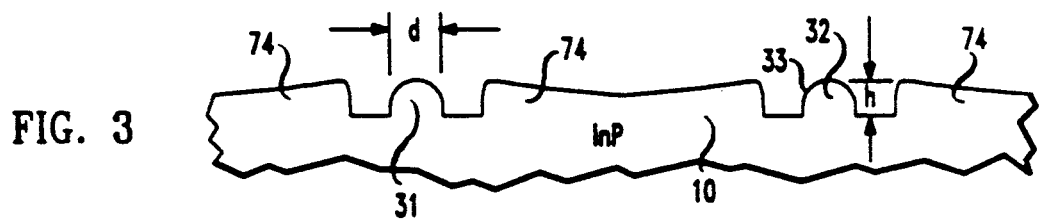

Note also that the volume of each of the resist islands 21 and 22 (FIG. 2) will depend, among other parameters, upon the thickness of the resist islands 11 and 12 (FIG. 1) respectively. Then the entire top surface 23 of the structure is subjected to a reactive ion beam etching (RIE)—for example, with a plasma formed using the source gas $CCl_2F_2$—typically for a time interval sufficient to remove the entire thickness of the resist. At the same time, the portions of the top surface 23 of the substrate 10 which are not coated with the resist are also etched at a rate relative to that of the resist which controlled by the parameters of the RIE process, so that at the conclusion of the RIE process, the top surface 33 (FIG. 3) of the substrate 10 is characterized by a pair of dome-shaped InP regions 31 and 32, the desired microlenses, each having a height h. The ratio h/h' is determined by the relative ratio of etching the resist vs. the InP, as controlled by the etching parameters (such as RIE chamber pressure and substrate temperature). The auxiliary InP portions 74 (FIG. 3) surround the dome-shaped InP regions 31 and 32, and underlie the regions where the auxiliary resist portions 64 (previously FIG. 2) existed.

The tops of the dome-shaped InP island regions 31 and 32 (FIG. 3) thus protrude slightly (but only slightly) above the highest points of the auxiliary InP portions 74 surrounding these islands, and thus these dome-shaped InP islands form the desired partially recessed microlenses: the larger the volume of surrounding associated auxiliary resist portions 74 (FIGS. 1 and 4) per island, the smaller the protrusions of each microlens, i.e., the more the recess. Full recess, however, cannot be obtained in this manner.

In the case of InP being reactive ion etched with a plasma formed by using the source gas $CCl_2F_2$, typical parameters of the etching process are:

Pressure = 0.6 to 3 Pascal
RF Power density = 0.1 to 2.0 Watts/cm$^2$
RF Frequency = 13.56 MHz
Flow Rate = 2 to 50 sccm In any event, preferably the power density and the pressure should be adjusted to result in a bias voltage of approximately 600 to 700 volts.

In the case of a GaAs (gallium arsenide) substrate typically the source gas is essentially pure $CCl_2F_2$ or is mixed with $O_2$ (about 5 to 20 mole percent), and the same etching parameters can be used as were used for the InP substrate.

Figure 5:
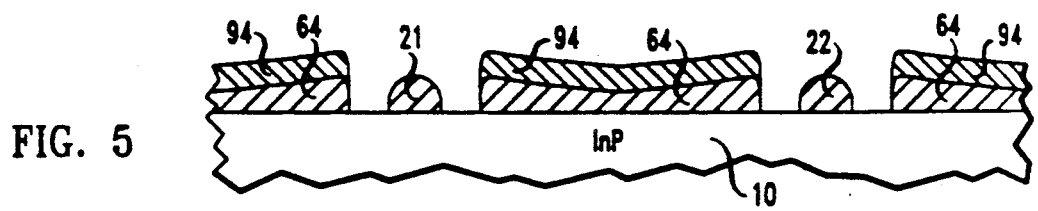
FIGS. 5-6 are side view diagrams in cross section of various stages of manufacture of a pair of microlenses being fabricated in accordance with another specific embodiment of the invention.
Figure 6:
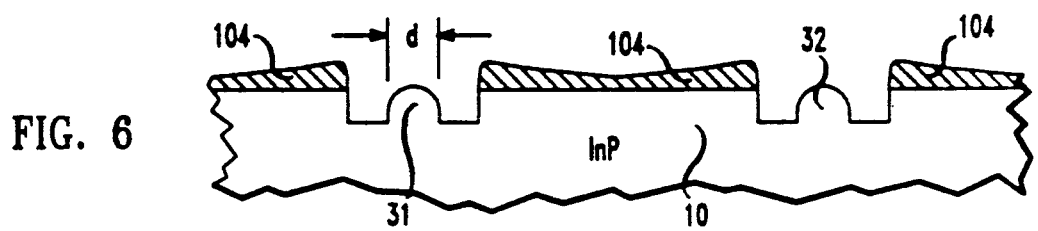

FIGS. 5-6 show a modification, to achieve full recess of the microlenses. In particular, after a structure has been hard-baked as indicated previously regarding the structure shown in FIG. 2, another resist layer is deposited to a uniform thickness over the top surface, is patterned, and is hard-baked, in order to form a patterned hard-baked resist layer 94 superposed on the hard-baked auxiliary resist layer 64 (but not on the resist islands 21 and 22), as indicated in FIG. 5. Note that in this patterning to form the hard-baked patterned resist layer 94, since the resist islands 21 and 22 have already been hard-baked, they will not dissolve in the typically wet etch used for this patterning, so that they will be protected automatically against the etching (developing) during patterning. Thus, of concern here is only the patterning of the resist layer 94 in registry with the edges of the auxiliary hard-baked resist layer 64, but not of the resist islands 21 and 22. Finally, another RIE process—which can be of the same kind as previously described—produces greater or even fully recessed lenses 31 and 32—i.e., fully recessed with respect to the top surfaces of the remaining (thinner) resist portions 104 located between the lenses 31 and 32 (FIG. 6). The thickness of these lenses typically is in the approximate range of about 1 to 20 μm. If the RIE process is optionally carried out further, then the resist portions 104 are completely removed, and the entire top surface of the auxiliary portions, as well as of the lenses, will be composed of InP.

It should be noted that diameter d of the islands, and hence of the microlenses, for uses other than for APDs or LEDs or for other substrates (such as silicon, glass, sapphire, or quartz) is typically about 5 to 500 μm.

In the case of quartz being reactively ion etched by a glow discharge, the etching plasma parameters using the source $CHF_3$ or $CCl_2F_2$ are typically:

Pressure = 0.6 to 3 Pa
Power density = 1 watt/cm$^2$
Frequency = 13.56 MHz
Flow rate = 10 to 50 sccm Although the invention has been described in detail with respect to specific embodiments, various modifications can be made without departing from the scope of the invention. For example, at the bottom of the substrate an avalanche photodetector (APD) or a light emitting diode can be integrated, in order to couple light respectively from or to a fiber located above the top surface of the lens at the top surface of the substrate, with the fiber oriented perpendicular to the top surface of the substrate. Instead of $CCl_2F_2$, other etchants may be used, such as silicon tetrachloride ($SiCl_4$), boron trichloride ($BCl_3$), chlorine ($Cl_2$), bromine ($Br_2$), chlorotrifluoromethane ($CF_3Cl$), bromotrifluoromethane ($CBrF_3$), and dichlorofluoromethane ($CHCl_2F$) alone or in combination with secondary gases such as $O_2$ or $SF_6$. Instead of resists or photo-resists, other materials can be used—such as polyimide or a phosphosilicate glass—that can be patterned and thermally relaxed to form a hard-baked island having a prescribed perimeter, such as a sessile drop. Instead of removing the entire thickness of the hard-baked resist by the RIE (transition from FIG. 2 to FIG. 3), only a portion of the thickness can be removed, whereby the resulting optical lens is effective only for peripheral rays of light being transmitted by the lens. Finally, in addition to quartz, other oxide glasses can be used as the substrate, such as borophosphosilicate glasses, and germanium-silicon oxide.

I claim:

1. A method of forming an at least partially recessed lens in a prescribed portion of a substrate, the lens having a prescribed perimeter, comprising the steps of:
   (a) forming and baking a first patterned layer overlying a surface of the substrate to a temperature above which deformation of the first patterned layer to a minimal surface occurs, the first patterned layer having both an island portion overlying the prescribed portion of the substrate and an auxiliary portion surrounding the island portion, whereby the island portion of the first patterned layer becomes a hard-baked island portion of the first patterned layer having the prescribed perimeter and a prescribed volume and the auxiliary portion of the first patterned layer becomes a hard-baked auxiliary portion of the first patterned layer surrounding the hard-baked island thereof and having a larger volume than the prescribed volume; and
   (b) subjecting both the substrate and the hard-baked island and auxiliary portions of the first patterned layer simultaneously to an etching simultaneously with a gaseous chemical species and an energetic ion species sufficient to remove at least a portion of the thicknesses of both the hard-baked island and the auxiliary portions of the first patterned layer.

2. The method of claim 1 in which the first patterned layer is a first patterned resist layer.

3. The method of claim 2 in which the substrate is essentially InP.

4. The method of claim 3 in which the etching is implemented by glow discharge of $CCl_2F_2$.

5. The method of claim 2 in which the substrate is essentially GaAs.

6. The method of claim 5 in which the etching is implemented by glow discharge of $CCl_2F_2$ or a mixture of $CCl_2F_2$ and $O_2$.

7. A method of forming a fully recessed lens in a prescribed portion of a substrate, the lens having a prescribed perimeter, the method comprising the steps of claim 1 wherein, prior to step (b) thereof, a second hard-baked patterned layer is formed covering the hard-baked auxiliary portions of the first patterned layer.

8. The method of claim 7 in which the first or second patterned layer, or both, is a patterned resist layer.

9. The method of claim 8 in which the substrate is essentially InP.

10. The method of claim 9 in which the etching is implemented by glow discharge of $CCl_2F_2$.

11. The method of claim 8 in which the substrate is essentially GaAs.

12. The method of claim 11 in which the etching is implemented by glow discharge of $CCl_2F_2$ or a mixture of $CCl_2F_2$ and $O_2$.

13. The method of claim 1 in which the substrate is essentially quartz.

14. The method of claim 13 in which the etching is implemented by glow discharge of $CCl_2F_2$.

15. The method of claim 1 in which the material of first patterned layer is essentially a resist and in which the volume of resist in the first patterned resist layer associated with the island exceeds the volume of resist contained in the island itself.

16. The method of claim 15 in which the etching step is reactive ion etching.

17. The method of claim 15 in which the etching step is chemically assisted ion beam etching.

* * * * *